June 8, 1971 R. L. GROWNEY 3,583,063

PROCESS FOR SOLDERING PRINTED BOARD ASSEMBLIES UTILIZING PASTE SOLDER AND INFRARED RADIATION

Filed April 24, 1970

Inventor
ROBERT L. GROWNEY
BY Mueller, Aichele & Rauner
ATTYS.

United States Patent Office 3,583,063

Patented June 8, 1971

3,583,063

PROCESS FOR SOLDERING PRINTED BOARD ASSEMBLIES UTILIZING PASTE SOLDER AND INFRARED RADIATION

Robert L. Growney, Schaumburg, Ill., assignor to Motorola, Inc., Franklin Park, Ill.

Continuation-in-part of abandoned application Ser. No. 705,111, Feb. 13, 1968. This application Apr. 24, 1970, Ser. No. 31,721

Int. Cl. B23k *31/02*

U.S. Cl. 29—471.1 10 Claims

ABSTRACT OF THE DISCLOSURE

Process for soldering components on printed circuit boards, wherein solder is applied in paste form to conductors on the board and passed through an oven to cure the same. The boards with the solder thereon can be stored, or can be immediately used, in which case components are placed on the boards with leads inserted in openings in the conductors and boards. The boards with the solder and components thereon are gradually preheated, and the solder is then heated by infrared radiation focused thereon to cause the solder to flow about the leads causing an electrical and mechanical connection. The preheating may be provided by diffused infrared radiation, by pulsing a heat source, or by other means.

This application is a continuation-in-part of application Ser. No. 705,111, filed Feb. 13, 1968, now abandoned.

BACKGROUND OF THE INVENTION

It has been known to automatically solder electronic components to printed circuit boards by processes known as wave soldering and dip soldering. In the wave soldering process, the printed circuit board assembly is passed over a solder pot which has an agitator therein to cause the solder to raise in waves to engage the board. In dip soldering the board with the components thereon is lowered into the solder pot to cause soldering of conductors to the printed circuits on the board. Although these systems have the advantage that they save time as compared to hand soldering, they present serious problems. In either case the solder which engages the printed circuit board and the component leads becomes contaminated so that it does not provide the effective electrical connections desired. The solder may inadvertently bridge parts which are not to be connected to form a short, and may cause movement of the components so they are not in the desired position on the board. For these and other reasons, significant maintenance is required to maintain either a wave soldering or a dip soldering process operative, and considerable patch-up work is required on the soldered boards.

Another problem with wave and dip soldering is that the equipment required involves substantial equipment cost and in many cases it is not readily adaptable from one product to another. This results in a high capital equipment expense, and at the same time the performance has been less than desirable. Particular problems have been encountered where the assembly being soldered has many components in a very small space.

SUMMARY OF THE INVENTION

It is an object of the invention to provide a process for soldering components to printed circuit boards wherein the solder is applied as a paste to the conductors on the boards, and radiant energy is focused onto the solder to produce the soldering operation.

A further object is to provide an improved automatic soldering process wherein there is no contamination of the solder and a good soldering connection is provided.

Another object of the invention is to provide an improved soldering process wherein the equipment required to practice the process involves a minimum capital equipment cost and minimum maintenance costs.

A still further object of the invention is to provide an improved soldering process for printed circuit boards wherein no undesired bridging of conductors, or shorts, is produced by the solder.

The soldering process of the invention is practiced by applying semi-liquid or paste solder on the conductors of a printed circuit board and heating the same to cure the solder. The boards can then be stored for an indefinite period of time. When it is desired to solder components onto the boards, they may be placed on a conveyor for automatic processing. The components are placed on the boards with the leads thereof inserted in openings in the conductors and the boards. The boards with the components thereon may then be gradually preheated to bring the solder close to the temperature required for forming an effective solder connection. Infrared radiation is then focused on the solder to provide the temperature required to cause the solder to flow.

It may be desired to use a mask to shield the parts of the insulating board which are not being soldered from the infrared energy. The preheating can be provided by radiation from an infrared source which is distributed over the preheating region by a flat reflector, and the intense heat for soldering can be focused on the solder layer from a second infrared source by an elliptic reflector which concentrates the radiant energy.

DESCRIPTION OF THE PREFERRED EMBODIMENT

Figure 1:
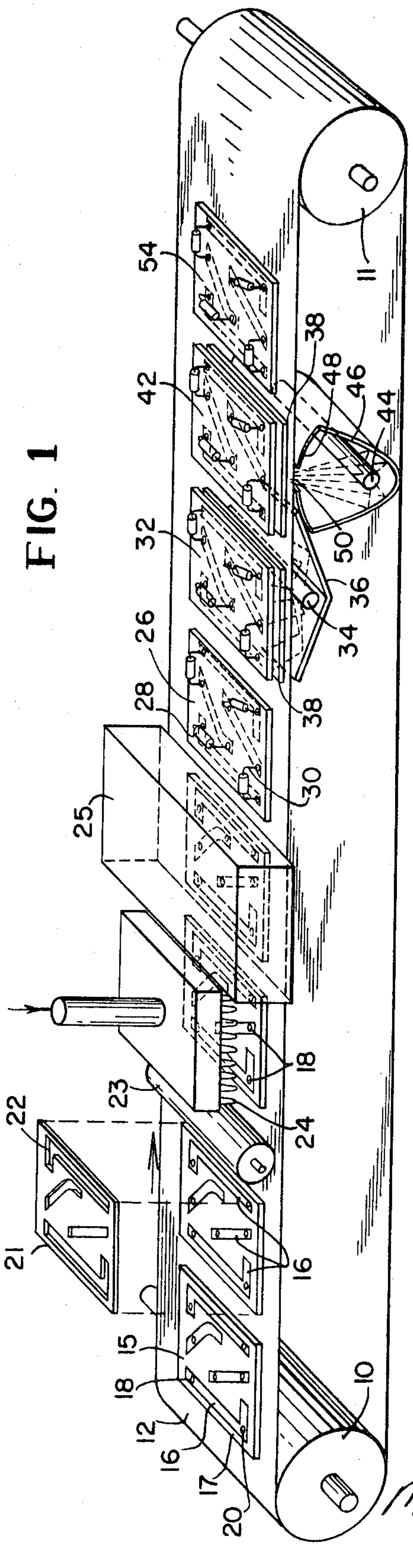
FIG. 1 illustrates the welding process of the invention.

The process of the invention is illustrated in the drawing wherein FIG. 1 schematically represents automatic equipment for soldering printed circuit assemblies. A conveyor apparatus includes end pulleys 10 and 11 which support a belt 12 or the like on which the printed circuit boards are positioned. The printed circuit boards 15 may be constructed in known manner with conductor 16 on one or both sides of an insulating sheet 17. The conductors have openings 18 therein which may be aligned with openings in the insulating board. Eyelets or ferrules 20, of known construction, can be provided in the openings engaging the conducting layers.

As the boards move to the right on the conveyor, solder in paste form is applied on the conductors 16. To apply the solder only on the conductors, a mask 21 is positioned on the board having openings 22 in the areas of the conductors. The solder is applied through the openings 22 by a roller 23, or by a brush or a squeegee.

As the boards continue to move to the right, air from device 24 is directed on the covered boards to blow the solder from the openings 18 in the conductors, so that these openings are free for the insertion of component leads therein.

The printed boards with the solder paste thereon is next passed into an oven 25. The oven is held at a low temperature which causes the solder paste to cure and become hardened. The boards with the hardened solder paste can then be stored or can be immediately used.

In the process illustrated in FIG. 1, the conveyor moves the boards from the oven to a position 26 at which the boards are turned over, and components are placed on the boards. The components 28 have leads 30 which extend through the openings in the boards and in the conductors. As previously stated, eyelets may be provided in the openings to receive the leads, and which engage the conducting layers.

The boards with the components thereon are next moved into a preheat region 32 and the fluxes in the solder are activated by the heat. The solder is on the conductors which are now on the bottom side of the boards, so that the heat is directed thereon. This preheat region can be provided by an elongated infrared lamp 34 positioned in a trough shaped reflector 36 which directs the heat from the lamp 34 over a wide area extending from the position 32 to the position 42. The reflector 36 is constructed so that the temperature of the board gradually increases as the board is moved from position 32 toward position 42.

At position 42 more intense energy is directed on the solder by a second infrared lamp 44 positioned at one focal point of an elliptical reflector 46. The reflector has an elliptical cross-section and the lamp is an elongated tubular unit extending along the line defining one focal point of the reflector. The energy is, therefore, focused along the line defining the second focal point which is in the plane of the solder on the conductors. A top plate 48 is connected across the elliptical reflector 46, and has an arcuate shape with its center at the infrared lamp 44. A slit 50 is provided along the center of the top plate 48 for the focused energy to pass therethrough to engage the solder on the conductor.

The solder provided in paste form may be composed of lead-tin powder, a solder flux and a plasticizer. The proportions may be about 76% lead-tin powder, 16% flux and 8% plasticizer. The lead-tin powder may be made up of about 59% tin and 40% lead, with traces of other metals such as copper, nickel, antimony, silver and bismuth. The solder flux may be rosin with a chloride activator. Ethylene glycol can be used as the plasticizer.

This paste solder can be cured at a low temperature, of the order of 210° to 250° Farenheit. This causes the volatile glycol to evaporate to harden the solder paste to facilitate assembly of components on the printed circuit board. When the cured solder paste is heated to a temperature of 400° Farenheit or above, the lead-tin powder will melt and flow to make a solder connection between the conductors provided on the circuit board and the connecting leads of components.

One curable solder paste which is suitable for use as described is supplied by Alpha Metals, Inc., Jersey City, N.J., identified as Alpha Solder Creme #890–06.

Figure 2:
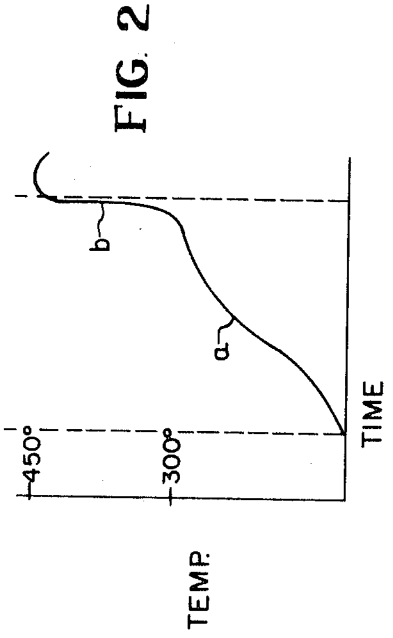
FIG. 2 is a chart showing the temperature of the solder in the process of FIG. 1.

FIG. 2 illustrates the heating effect on the solder by the preheating and by the focused radiant energy. In the preheat region, the temperature gradually increases to about 300° F. as shown by the portion *a* of FIG. 2. When the radiant energy is focused on the solder from the source 44 at position 42, the temperature of the solder increases rapidly as shown by the portion *b* of FIG. 2. This will provide a temperature of the order of 450° F. which will cause the solder to flow so that it will engage the leads in the openings in the conductors or eyelets and provide an effective solder connection between the leads and the conductors or between the leads, the eyelets and the conductors.

A mask 38 may be positioned between the infrared lamps and the board to be soldered, to shield portions of the board which are not to be soldered from the radiant energy. This may be made of stainless steel and have the same pattern as the mask 21 through which the solder is applied. That is, the energy must be applied to the same areas to which the solder was applied. The insulating board may be made of a phenolic material which changes characteristics in the presence of the heat intensity used to cause the solder to flow.

The automatic process illustrated in FIG. 1 may include the further position 54 at which a defluxing operation is provided. This is a known operation and may not be necessary in certain applications.

In order to provide maximum reflectivity, the reflecting surfaces of the reflectors 36 and 46 are preferably gold plated. Similarly, the reflection surface on the top plate 48 may be gold plated. This top surface reflects radiation back to the focus of the elliptical reflector which directs the same through the slit 50 so that the energy is concentrated at the solder.

Although the process has been shown with a conveyor for automatically moving the board from one position to another for the various process steps, it is obvious that various other arrangements can be used. For example, the preheating can be provided in a fixed position with the same source producing the preheat and the final radiant energy. By pulsing this source, the heat can be caused to build up gradually until the final heat is obtained. It may also be desired to simultaneously heat solder on conductors on opposite sides of an insulating board, and to do this heating elements can be positioned both above and below the board. It may be preferable to provide the heating elements above the board when only a single layer of solder is heated, rather than below the board, as illustrated.

What is claimed is:

1. The method of soldering components having conductive leads to a printed circuit board having conductors with openings therein for receiving the component leads, including the steps of, applying solder in paste form which hardens on curing to the conductors of the printed circuit board, heating the board and the solder thereon to cure and harden the solder, placing components on the printed circuit board with the leads thereof in the openings of the conductors, preheating the printed circuit board with the solder and components thereon, and focusing radiation from an infrared source onto the solder on the conductors of the printed circuit board to cause the solder to flow and make electrical and mechanical connections between the component leads and the conductors on the board.

2. The method in accordance with claim 1 wherein the printed circuit board is positioned on a conveyor and is moved thereby in sequence to different positions for the process steps.

3. The method in accordance with claim 1 wherein radiant energy is directed to the printed circuit board from a second infrared source for preheating the solder prior to the focusing of the infrared radiation on the solder to cause the same to flow.

4. The method in accordance with claim 1 including the step of placing a mask on the printed circuit board having openings registering with the conductors thereon, and applying solder through the openings in the mask to the conductors.

5. The method in accordance with claim 1 including the step of placing a mask between the infrared source and the printed circuit board having openings registering with the conductors thereon to shield the remainder of the board from the radiation from the source.

6. The method in accordance with claim 1 wherein radiant energy is focused from an elongated infrared lamp by a reflector of elliptical cross section positioned with one focus along the axis of the infrared lamp to concentrate the energy at the second focus which is aligned with the solder.

7. The method of soldering components having conductive leads to a circuit board having conductors thereon, including the steps of, providing on the conductors of the circuit board a layer of paste solder which hardens on curing, heating the board and solder to cure and harden the same, placing the conducting leads of components in engagement with the solder on the conductors, preheating the circuit board with the solder and components thereon, and focusing infrared radiation onto the solder on the conductors of the circuit board to cause the solder to flow and make electrical and mechanical connections between the component leads and the conductors on the board.

8. The method in accordance with claim 7, wherein the solder is heated to a temperature of the order of 210° Farenheit to cure the same, and is heated to a temperature of 400° Farenheit or higher by the infrared radiation.

9. The method in accordance with claim 7 wherein infrared radiation is directed onto the circuit board for preheating the solder prior to the focusing of the radiation thereon to cause the same to flow.

10. The method in accordance with claim 7 including the step of placing a mask having openings therein registering with the conductors between the infrared radiation and the circuit board, whereby the radiation is focused on the solder on the conductors and the remainder of the board is shielded from the radiation.

References Cited

UNITED STATES PATENTS

| | | | |
|---|---|---|---|
| 1,748,403 | 2/1930 | Wentworth | 128—395X |
| 2,198,867 | 4/1940 | Fair et al. | 128—395X |
| 3,073,270 | 1/1963 | Johnson et al. | 29—502X |
| 3,084,650 | 4/1963 | Johns | 29—488X |
| 3,294,951 | 12/1966 | Olson | 29—471.1X |
| 3,374,531 | 3/1968 | Bruce | 29—471.1X |
| 3,386,166 | 6/1968 | Tardoskegyi | 29—471.1X |
| 3,435,520 | 4/1969 | Copeland | 29—471.1X |

JOHN F. CAMPBELL, Primary Examiner

R. B. LAZARUS, Assistant Examiner

U.S. Cl. X.R.

29—497, 502; 219—85